(12) United States Patent
Pezeshki et al.

(10) Patent No.: US 12,132,146 B2
(45) Date of Patent: Oct. 29, 2024

(54) P-TYPE DOPING IN GAN LEDS FOR HIGH SPEED OPERATION AT LOW CURRENT DENSITIES

(71) Applicant: AvicenaTech Corp., Sunnyvale, CA (US)

(72) Inventors: Bardia Pezeshki, Mountain View, CA (US); Cameron Danesh, Mountain View, CA (US)

(73) Assignee: AvicenaTech, Corp., Sunnyvale, CA (US)

( * ) Notice: Subject to any disclaimer, the term of this patent is extended or adjusted under 35 U.S.C. 154(b) by 109 days.

(21) Appl. No.: 17/542,271

(22) Filed: Dec. 3, 2021

(65) Prior Publication Data

US 2022/0181518 A1    Jun. 9, 2022

Related U.S. Application Data

(60) Provisional application No. 63/121,096, filed on Dec. 3, 2020.

(51) Int. Cl.
| | | |
|---|---|---|
| *H04B 10/04* | (2006.01) | |
| *H01L 33/06* | (2010.01) | |
| *H01L 33/32* | (2010.01) | |
| *H04B 10/60* | (2013.01) | |

(52) U.S. Cl.
CPC ............ *H01L 33/06* (2013.01); *H01L 33/325* (2013.01); *H04B 10/60* (2013.01)

(58) Field of Classification Search
CPC .... H04B 10/116; H04B 10/40; H04B 10/502; H04B 10/112; H04B 10/1123; H04B 10/114; H04B 10/1143; H04B 10/1149; H01L 33/06; H01L 33/04; H01L 33/325; H01L 33/025; H01L 33/32; H01L 33/145

USPC ....... 398/118, 119, 127, 128, 129, 130, 131, 398/135, 136, 182, 183, 202, 208, 209, 398/158, 159, 164, 172; 257/13, 257/E33.008, 97, E33.03
See application file for complete search history.

(56) References Cited

U.S. PATENT DOCUMENTS

| | | | |
|---|---|---|---|
| 7,961,990 B2 | 6/2011 | Krishnamoorthy et al. | |
| 8,451,877 B1 | 5/2013 | Crawford et al. | |
| 8,704,252 B2* | 4/2014 | Wang | H01L 33/025 |
| | | | 257/97 |
| 10,840,408 B1* | 11/2020 | Yin | H01L 33/06 |

(Continued)

FOREIGN PATENT DOCUMENTS

KR    10-20100010364 A    2/2010

OTHER PUBLICATIONS

International Search Report on PCT Application No. PCT/US2021/061907 from International Searching Authority (KIPO) dated Apr. 5, 2022.

(Continued)

*Primary Examiner* — Hanh Phan

(57) ABSTRACT

A GaN based LED, with an active region of the LED containing one or more quantum wells (QWs), with the QWs separated by higher energy barriers, with some of the barriers doped and some of the barriers not doped, may be driven at high data rates with low drive current densities. Preferably the barriers that are not doped are the barriers closest to one side of a p region or an n region of the LED. With Mg doping, preferably the barriers that are not doped are the barriers closest to the p region of the LED.

22 Claims, 6 Drawing Sheets

(56) References Cited

U.S. PATENT DOCUMENTS

| | | | |
|---|---|---|---|
| 2014/0008607 A1* | 1/2014 | Wang | H01L 31/035236 |
| | | | 438/28 |
| 2019/0068280 A1 | 2/2019 | Liu et al. | |
| 2020/0303558 A1 | 9/2020 | Khatibzadeh et al. | |
| 2020/0303588 A1* | 9/2020 | Khatibzadeh | H04B 10/502 |
| 2021/0126164 A1* | 4/2021 | Broell | H01L 25/0753 |

OTHER PUBLICATIONS

Written Opinion on PCT Application No. PCT/US2021/061907 from International Searching Authority (KIPO) dated Apr. 5, 2022.

* cited by examiner

P-TYPE DOPING IN GAN LEDS FOR HIGH SPEED OPERATION AT LOW CURRENT DENSITIES

CROSS-REFERENCE TO RELATED APPLICATION(S)

This application claims the benefit of U.S. Provisional Patent Application No. 63/121,096, filed on Dec. 3, 2020, the disclosure of which is incorporated by reference herein.

FIELD OF THE INVENTION

The present invention relates generally to LEDs for data communications, and more particularly to high speed GaN based LEDs and data communications systems using high speed GaN based LEDs.

BACKGROUND OF THE INVENTION

There has been substantial interest in using high speed GaN based LEDs for data communications. One focus has been to combine data transmission with lighting ("LiFi"), where LED-based room lights would be modulated at high speed to transfer data to users in the room. Modulated LEDs incorporated on CMOS ICs can also be used to transmit data for short distance connections, ranging from intra-chip interconnects of a few mm across a large integrated circuit to rack-to-rack interconnects of 10 m or more in a datacenter. In all cases, it may be preferable to use optical sources that can be modulated at multiple gigabits-per-second, consume little power, and are reasonably efficient at generating photons. Conventionally, lasers are used as light sources for data transmission because they can be efficient and fast. However, lasers typically have a threshold current that limits the minimum power needed for each source. Thus, to obtain competitive power dissipation (often expressed as pico-Joules per bit), many lower speed data lines may be multiplexed through a Serializer/Deserializer (SERDES) to increase the overall bitrate before conversion to optics; it is simply not efficient to run lasers at low bit rates. However, the SERDES adds power consumption and latency.

Using LEDs as the light source changes the equation. LEDs have no fundamental threshold so better energy efficiency can be obtained compared to lasers. Furthermore, using very wide data-buses with one LED per relatively slow data line eliminates the power consumption, latency, and real-estate used by SERDES.

There is a trade-off of size and efficiency for LEDs. Very small devices, on the order of microns or tens of microns tend to be faster but are less efficient. The reason for the drop in efficiency for small devices is generally believed to be surface defects on the etched edges of the devices. The smaller the diameter of an LED, the larger the edge surface to emitting area ratio, and exposed surfaces can have non-radiative defects that cause recombination without emitting photons. Thus, lighting devices, where efficiency is paramount, are typically a few mm across to minimize edge effects; if the devices get too large, heat removal and cost/yield become problems.

On the other hand, carrier lifetime decreases as carrier density increases. Thus, at a given current, smaller devices are intrinsically faster because they operate at a higher current density. As a consequence, LEDs for data transmission are smaller as speed is also important.

A second reason why smaller devices operating at high current densities are less efficient than a larger device operating at low current densities is because of "droop." The main cause of this decreased efficiency is thought to be increased Auger non-radiative recombination and electron overflow over the active region. However, some droop or efficiency loss is sacrificed for speed in LEDs in data communication.

The reason why LEDs are faster at high current densities may be because carrier lifetime decreases. The total carrier recombination rate is combination of trap-induced defects (Shockley-Reed-Hall), radiative recombination, and Auger recombination. All these terms increase as carrier density increases. The total recombination, R, is related to the electron density in the intrinsic region, n, by:

$$R = An + Bn^2 + Cn^3 \quad (1)$$

Where A is the coefficient for non-radiative trap recombination, B is the spontaneous radiative emission, and C is the Auger recombination. Eq. (1) assumes the electron and hole densities in the intrinsic region are equal, which is reasonable because equal numbers are injected into that region.

The carrier lifetime, t, is given by:

$$1/t = A + Bn + Cn^2 \quad (2)$$

As the carrier density gets higher, the radiative and Auger recombination rates increase, shortening the carrier lifetime.

The efficiency of an LED depends on the ratio of the radiative recombination rate to the Auger and trap recombination rates, which can be expressed as:

$$\text{Efficiency} = Bn/(A + Bn + Cn^2) \quad (3)$$

So, the efficiency is low at very low current densities (~Bn/A), increases as n increases, reaches a maximum, and then drops as the $Cn^2$ term dominates. Unlike radiative recombination that requires electrons and holes to find each other in a single step, trap-assisted recombination takes two steps. These traps are very quickly filled with one carrier or another and then act as a recombination center when the other type of carrier arrives. Since these traps are assumed to be almost always filled, trap recombination time constant is not a function of the carrier density. The radiative recombination rate, however, does depend on the injected carriers finding each other, and at low current densities, this rate is low simply because there are not many free injected carriers available. As carrier density increases, the Auger process dominates, which requires not two carriers, but three to interact simultaneously. This process is non-radiative and usually results in the third carrier being injected to higher energies either in the valence or conduction band.

BRIEF SUMMARY OF THE INVENTION

Some embodiments provide a GaN based LED, with an active region of the LED containing one or more quantum wells (QWs), with the QWs separated by higher energy barriers, with some of the barriers doped and some of the barriers not doped. In some embodiments, barriers closer to an n side of the active region of the LED are doped, and barriers closer to a p side of the active region of the LED are not doped. In some embodiments, the doping is p doping. In some embodiments, the p doping is with magnesium (Mg). In some embodiments only the central portion of each doped barrier is doped while the rest of each barrier are undoped. In some embodiments the QWs are not doped.

Some embodiments provide an LED comprising: a p type GaN layer; an n type GaN layer; and a plurality of alternating quantum well layers and barrier layers between the p type GaN layer and the n type GaN layer, with some of the barrier layers being p doped and some of the barrier layers not being p doped, with the p doped barrier layers being more distal from the p type GaN layer than the not p doped barrier layers. In some embodiments the p doped barrier layers are doped with Mg. In some embodiments the LED has 5 quantum well layers and 5 barrier layers, and a first two of the barrier layers closest to the p type GaN layer are not p doped. In some embodiments the LED has 5 quantum well layers and 5 barrier layers, and a first three of the barrier layers closest to the n type GaN layer are not p doped.

Some embodiments provide an LED comprising: a p type GaN layer; an n type GaN layer; and a plurality of alternating quantum well layers and barrier layers between the p type GaN layer and the n type GaN layer, with a first two of the barrier layers closest to the p type GaN layer not being p doped and others of the barrier layers being p doped. In some embodiments the LED has a cross-sectional area between 16 and 400 micrometers$^2$, inclusive. In some embodiments the LED has a cross-sectional area between 64 and 1024 micrometers$^2$, inclusive.

Some embodiments provide a method of operating a GaN based LED, comprising: applying a current with a data rate of 1 Gb/s or greater to the LED, the LED having cross-sectional width no greater than 100 micrometers, the current having a magnitude less than a current that provides a current density of 500 Amperes/centimeter$^2$ to the LED, the LED having an optical bandwidth of at least 3 dB for the applied current. In some embodiments the current has a magnitude less than a current that provides a current density of 100 Amperes/centimeter$^2$ to the LED. In some embodiments the data rate is 1.2 Gb/s or greater. In some embodiments the current has a magnitude less than a current that provides a current density of 80 Amperes/centimeter$^2$ to the LED. In some embodiments the current has a magnitude less than a current that provides a current density of 60 Amperes/centimeter$^2$ to the LED. In some embodiments the data rate is 1.5 Gb/s or greater. In some embodiments the current has a magnitude less than a current that provides a current density of 60 Amperes/centimeter$^2$ to the LED and a magnitude greater than a current that provides a current density of 10 Amperes/centimeter$^2$. In some embodiments the LED includes a p type GaN layer and an n type GaN layer, and a plurality of alternating quantum well layers and barrier layers between the p doped GaN layer and the n doped GaN layer, with some of the barrier layers being p doped and some of the barrier layers not being p doped, with the p doped barrier layers being more distal from the p-type GaN layer than the not p doped barrier layers. In some embodiments the p doped barrier layers are doped with Mg. In some embodiments the LED has 5 quantum well layers and 5 barrier layers, and a first two of the barrier layers closest to the p type GaN layer are not p doped. In some embodiments the LED has 5 quantum well layers and 5 barrier layers, and a first three of the barrier layers closest to the n type GaN layer are not p doped. In some embodiments the LED includes a p type GaN layer and an n type GaN layer, and a plurality of alternating quantum well layers and barrier layers between the p doped GaN layer and the n doped GaN layer, with barrier layers closest to the p-type GaN layer not being p-doped and others of the barrier layers being p doped. In some embodiments the LED has a cross-sectional area between 16 and 400 micrometers$^2$, inclusive. In some embodiments the LED has a cross-sectional area between 64 and 1024 micrometers$^2$, inclusive.

Some embodiments provide a method useful in providing chip-to-chip communications, comprising: receiving a serial data signal stream; providing a drive current to a GaN based LED, the drive current based on data of the serial data signal stream to encode data of the serial data signal stream onto light emitted by the LED at a data rate of 1 Gb/s or greater, the drive current having a maximum magnitude in Amperes of less than 500 times an area of cross-sectional width of the LED in centimeters. In some embodiments the drive current has a maximum magnitude in Amperes of less than 100 times an area of cross-sectional width of the LED in centimeters. In some embodiments the LED has a cross-sectional width of 32 micrometers or less. In some embodiments the drive current has a maximum magnitude in Amperes between 100 times an area of cross-sectional width of the LED in centimeters and 10 times an area of cross-sectional width of the LED in centimeters. In some embodiments the LED includes a p type GaN layer and an n type GaN layer, and a plurality of alternating quantum well layers and barrier layers between the p doped GaN layer and the n doped GaN layer, with some of the barrier layers being p doped and some of the barrier layers not being p doped, with the p doped barrier layers being more distal from the p type GaN layer than the not p doped barrier layers. In some embodiments the p doped barrier layers are doped with Mg. In some embodiments the LED has 5 quantum well layers and 5 barrier layers, and a first two of the barrier layers closest to the p type GaN layer are not p doped. In some embodiments the LED has 5 quantum well layers and 5 barrier layers, and a first three of the barrier layers closest to the n-type GaN layer are not p doped. In some embodiments the LED includes a p type GaN layer and an n type GaN layer, and a plurality of alternating quantum well layers and barrier layers between the p doped GaN layer and the n doped GaN layer, with a first two of the barrier layers closest to the p-type GaN layer not being p doped and others of the barrier layers being p doped. In some embodiments the LED has a cross-sectional area between 16 and 400 micrometers$^2$, inclusive. In some embodiments the LED has a cross-sectional area between 64 and 1024 micrometers$^2$, inclusive.

These and other aspects and embodiments of the invention are more fully comprehended on review of this disclosure.

BRIEF DESCRIPTION OF THE FIGURES

FIG. 1a shows an example epitaxial structure for a GaN/InGaN based LED, in accordance with aspects of the invention.

FIG. 1b shows a conduction band energy diagram for the LED of FIG. 1a.

FIG. 5 graphs measured speed-efficiency product versus current density for differently sized LEDs of the structure of FIG. 1a.

DETAILED DESCRIPTION

In some embodiments of a GaN based LED, an active region of the LED contains one or more quantum wells (QWs), with the QWs separated by higher energy barriers. A GaN based LED includes a GaN/InGaN based LED. In some embodiments, some of the barriers are doped, and some of the barriers are not doped. In some embodiments, barriers closer to an n side of the active region of the LED are doped, and barriers closer to a p side of the active region of the LED are not doped. In some embodiments, the doping is p doping. In some embodiments, the p doping is with magnesium (Mg).

To further separate the Mg acceptors from the carriers in the QWs, in some embodiments only the central portion of each doped barrier is doped while the rest of each barrier (and QWs) are undoped.

It has been found that only doping barriers away from an edge of the p region and the active region of the LED, for example only doping barriers on the n side of the active region, significantly improves speed of operation of the LED, particularly at low current densities. It may be that doing so further separates the acceptors from the carriers, for example so that the negatively charged acceptors in the barriers will attract the holes, improving transport. At the same time, the quantum wells on the p-side of the active region, where most of the recombination is occurring, may be significantly separated from the acceptors that could reduce the quantum efficiency through increased non-radiative recombination.

Figures 1A, 1B:
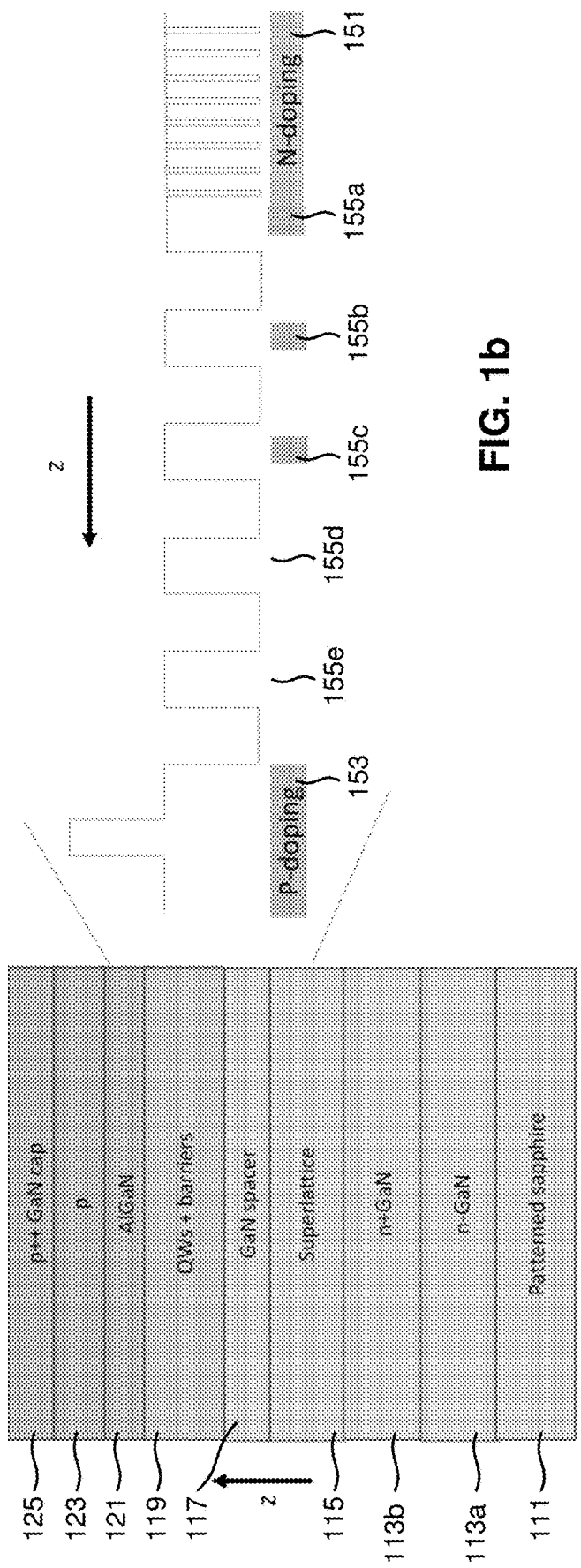

FIG. 1a shows an example epitaxial structure for a GaN/InGaN based LED. In some embodiments, the structure is grown using MOCVD on a patterned sapphire substrate 111 and has a relatively thick GaN buffer 113a,b all n type and silicon doped. In some embodiments, for example as shown in FIG. 1a, the structure also contains a superlattice 115 to help reduce defects, with the superlattice shown in FIG. 1a as on top of the GaN buffer. An active region is comprised of one or more InGaN QWs separated by GaN barriers (together, 119). In some embodiments an n-doped GaN spacer 117 is between the superlattice and the active region. In some embodiments, above the active region is an AlGaN electron barrier 121, a thin p type region 123 and a highly doped cap GaN layer 125 for making a good electrical contact. In some embodiments, and as referenced in FIG. 1b, there are five QWs, where only the three barriers on the n side are doped, with for example Mg. In some embodiments there may be a fewer number of QWs, and in some embodiments there may be a greater number of QWs. In some embodiments only the central portion of each barrier is doped while the rest of each barrier (and QWs) are undoped. In some embodiments, the barriers are 10-20 nm wide. In some embodiments, the Mg doping is in a $>10^{19}/cm^3$ range.

In some embodiments the GaN buffer includes a 3 um n-GaN layer 113a on top of the patterned sapphire substrate, with a 3 um n+GaN layer 113b on top of the n-GaN layer. In various embodiments the n-GaN layer and the n+GaN layer may be 2 um to 4 um thick. The n-GaN layer and the n+GaN layer may both be silicon doped. The n+GaN layer may have higher doping for improved electrical contact, for example with the superlattice layer. The superlattice may be formed of alternating quantum wells and barriers. For instance, the superlattice may be formed of 30 1 nm quantum wells and a 5 nm barrier, with a silicon doping of $10^{18}/cm^3$. In some embodiments the superlattice may comprise 20-40 QWs that are approximately 1 nm-wide separated by approximately 5 nm-wide barriers, with a silicon doping in the range of $3\times10^{17}$-$3\times10^{18}/cm^3$. The GaN spacer may be a 50 nm layer with a silicon doping of $10^{18}/cm^3$ or, in some embodiments, $10^{19}/cm^3$. In some embodiments the active region includes QWs comprised of some percentage of Indium, for instance 10%-15% Indium. In some embodiments the active region includes 12% InN quantum wells, for example of 3.3 nm. In some embodiments the barriers are in the range of 10 nm-20 nm thick. In some embodiments the barriers are 14.8 nm thick. In some embodiments doping of the barriers is nominally $1.2\times10^{19}/cm^3$. In some embodiments the interfaces of the barrier, for example to a depth of 15 Angstroms, is undoped or intrinsic. In some embodiments the AlGaN electron barrier is a 30 nm layer. In some embodiments the AlGaN electron barrier is doped with Mg, with a doping for example of $10^{20}/cm^3$. In some embodiments the thin p type region is 100 nm, with doping of $10^{20}/cm^3$, for example of Mg. The highly doped cap GaN layer may be a 5 nm layer with p++ doping, which may be very high Mg doping.

FIG. 1b shows a conduction band energy diagram for the LED of FIG. 1a. Quantum efficiency and speed are believed to be maximized when holes-electron pairs recombine in the QWs. The example of FIG. 1b assumes the LED includes 5 QWs, separated by barriers. The diagram additionally shows n doping 151 in an n region of the LED, p doping 153 in a p region of the LED, and p doping 155a-c of three of the five barriers. The three doped barriers are closest to the n region, with the two barriers 155d,e closest to the p region undoped.

Figure 2:
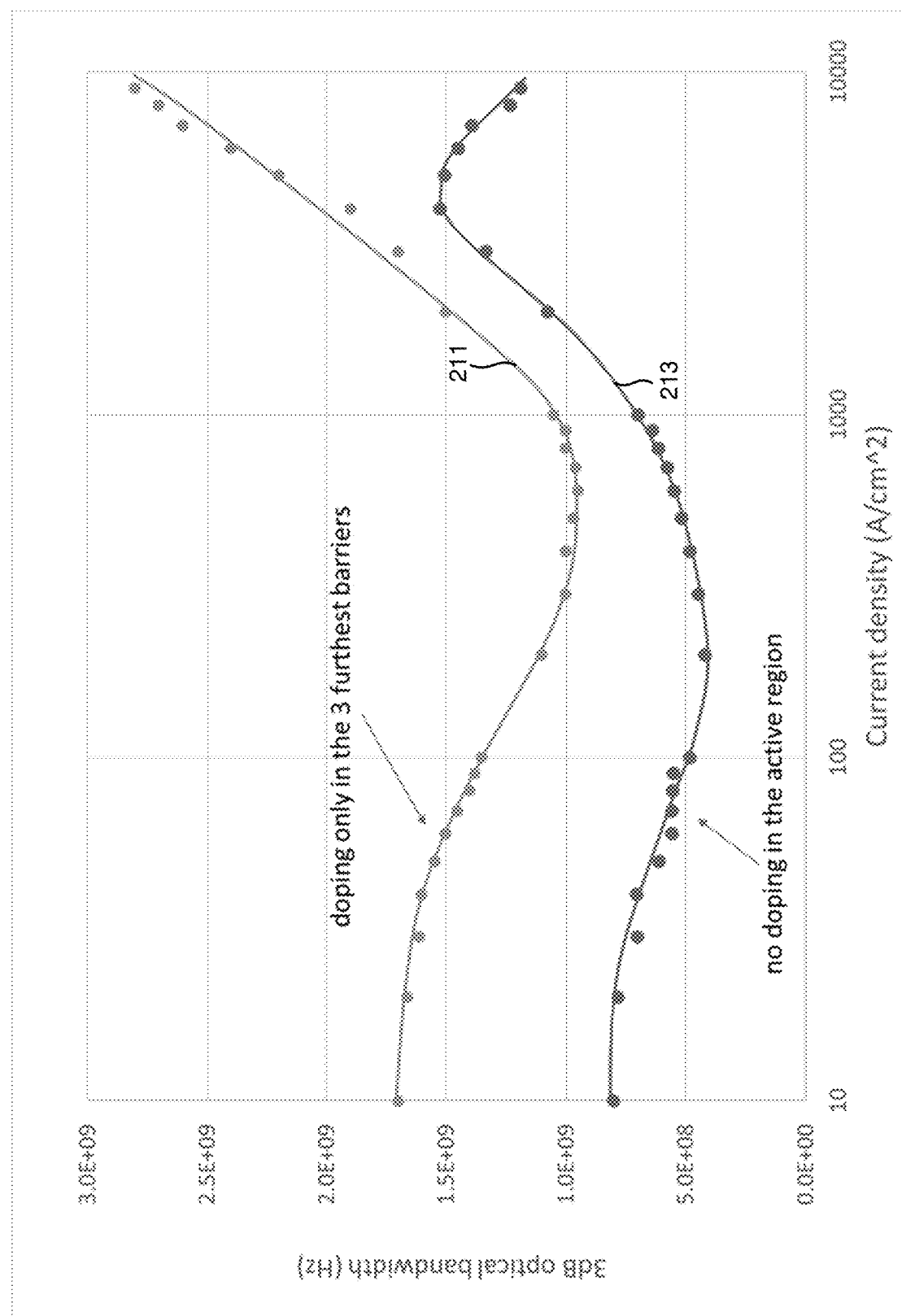
FIG. 2 graphs measured 3 dB optical bandwidth versus current density for the structure of FIG. 1a and for a standard LED with no doping in the active regions.

FIG. 2 graphs measured 3 dB optical bandwidth versus current density between about 10 A/cm$^2$ and 10000 A/cm$^2$ for the structure of FIG. 1a (211) and for a standard LED with no doping in the active regions (213). As FIG. 2 shows, the 3 dB optical bandwidth of the structure of FIG. 1a is about double the standard LED at low current densities, for example below about 400 A/cm$^2$, and even greater at current densities below about 100 A/cm$^2$. At higher current densities, for example over about 250 A/cm$^2$, the 3 dB optical bandwidth of the standard structure starts to roll over and decrease, while the 3 dB bandwidth of the structure of FIG. 1a continues to increase. The roll over in 3 dB optical bandwidth for the standard LED is presumably due to poor injection of holes into the active region and electron overflow out of the active region.

Figure 3:
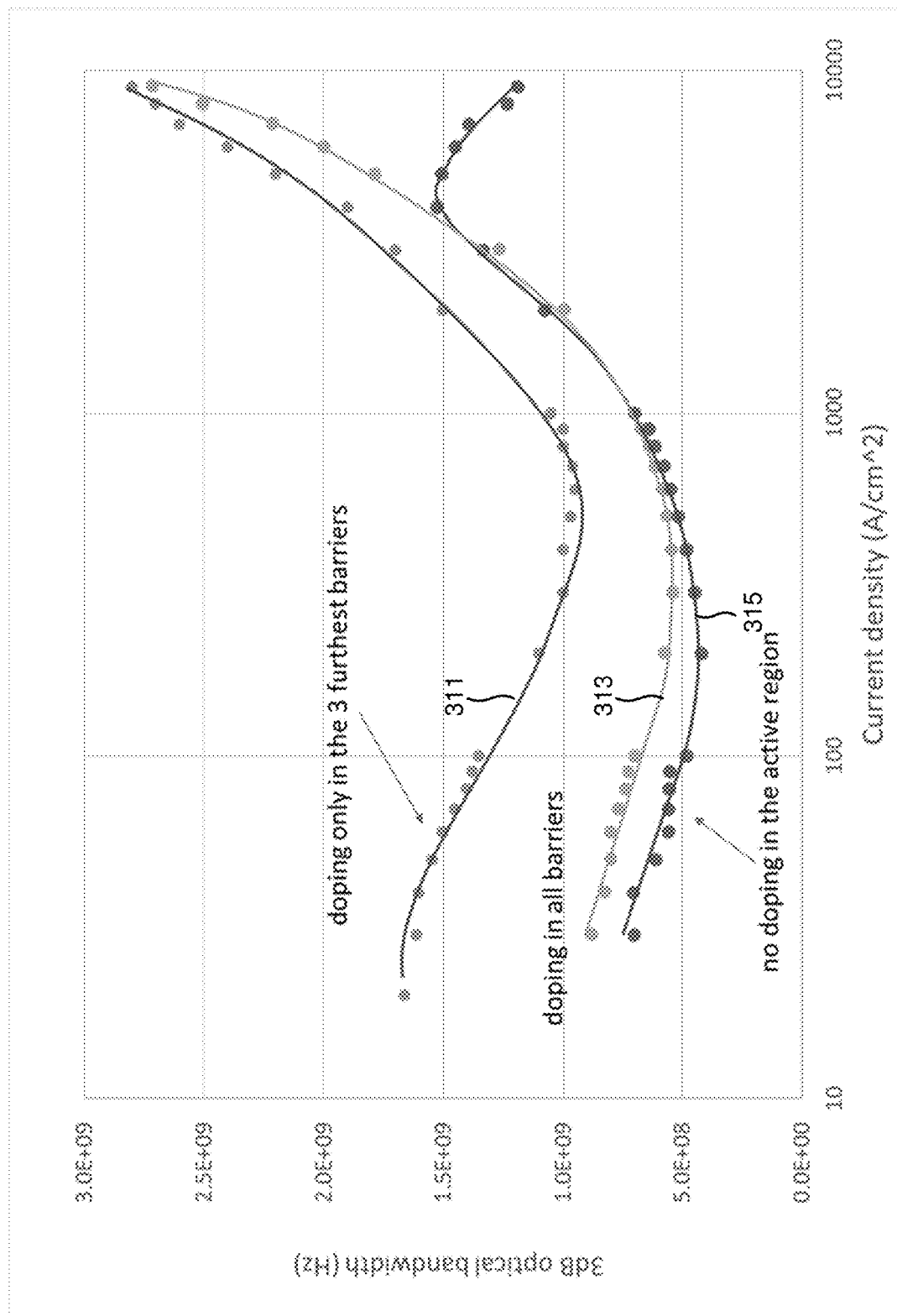
FIG. 3 graphs the measured 3 dB optical bandwidth versus current density for the structure of FIG. 1a, for a structure similar to that of FIG. 1a but with Mg doping in all of the barriers, and for a standard LED with no doping in the active region.

FIG. 3 graphs the measured 3 dB optical bandwidth versus current density for the structure of FIG. 1a (311), for a structure similar to that of FIG. 1a but with Mg doping in all of the barriers (313), and for a standard LED with no doping in the active region (315). Doping in all barriers is seen to show some increase in 3 dB optical bandwidth at lower current densities compared to the standard LED, but significantly less of an increase than for doping in only barriers closer to the n side of the active region. At higher current densities, doping in all barriers also avoids the roll over in 3 dB optical bandwidth seen for the standard LED. Again, however, doping in only barriers closer to the n side of the active region provides improved performance, albeit with the improvement being less than the improvement at low current densities.

It was mentioned above that doping barriers away from the p region further separates the acceptors from the carriers, for example so that the negatively charged acceptors in the barriers will attract the holes, improving transport, while the quantum wells on the p side of the active region, where most of the recombination is occurring, may be significantly separated from the acceptors that could reduce the quantum efficiency through increased non-radiative recombination. Analytically, possible reasons for this effect may be as follows.

If the active region is p doped resulting in an equilibrium hole density of $p_0$ and injected hole and electron concentrations of p and n, Equation (2) now becomes:

$$1/\tau = A + B(p_0+p) + C_{e\text{-}e\text{-}h}n(p_0+p) + C_{h\text{-}h\text{-}e}(p_0+p)^2 \quad (4)$$

Where $C_{e\text{-}e\text{-}h}$ is the Auger coefficient for two electrons and a hole interacting, resulting in one of the electrons being energized high into the conduction band and $C_{h\text{-}h\text{-}e}$ is the Auger coefficient for two holes and an electron interacting to send one of the holes deep into the valence band. Comparing Eq. (4) to Eq. (2), one can see that when n and p are much less than $p_0$ (i.e. at low drive current densities), the radiative second term is substantially increased and that the overall lifetime t is decreased.

A second advantage of doping the active region, especially if the doping is p type, is that it is believed that doing so helps with the transport problems. As previously mentioned, the electrons have much higher mobility than the holes. At high current densities, this may cause problems with getting enough holes in the active region, and which in turn causes electron overflow. The higher mobility of the electrons means many electrons shoot straight through the active region and recombine in the p-type GaN, while not enough holes are injected from the p-side. Doping the p type region provides a ready supply of holes and helps deplete the electrons, slowing overflow.

However, there is a draw-back to doping the active region p type, in that the normal p type dopants like Mg also act as non-radiative recombination centers, increasing A in the above equation (4), and reducing quantum efficiency. Thus, p doping the quantum well active region makes no sense in lighting applications. However, in communications applications where modulation speed is very important, p doping the active region may provide attractive benefits.

As mentioned above, in some embodiments, within the active region only the barriers between the QWs are p-doped, for instance with Mg. This spatially separates the Mg acceptors from the carriers in the QWs, which reduces the interaction between the carriers and the dopants. Furthermore, this increases the percentage of Mg-doped sites that are "activated", e.g. that act as acceptors and contribute to the hole density. This increased activation for acceptors in barriers relative to wells is because there is increased energy-loss associated with ionization of the acceptors in wells, since the hole can fall into the well. It also increases the activation of the Mg, as the Mg is in a higher energy state and more likely to accept an electron and generate a hole. In bulk GaN, Mg activation is low, with only about 1% of the atoms generating holes. This activation, however, is much higher when the Mg is placed in the barriers and not in the wells.

Doping barriers away from the p region further separates the acceptors from the carriers, for example so that the negatively charged acceptors in the barriers will attract the holes, improving transport. Not doping barriers closer to the p region separates the quantum wells on the p-side of the active region, where most of the recombination is occurring, from the acceptors that could reduce the quantum efficiency through increased non-radiative recombination.

Figure 4:
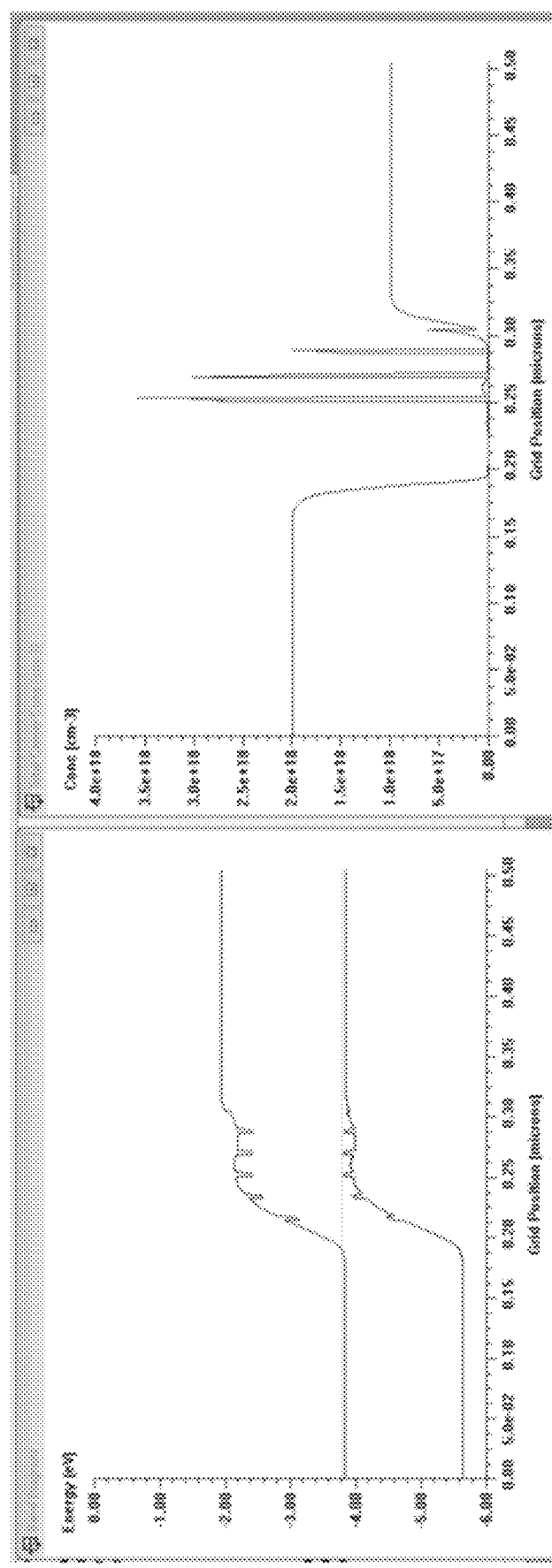
FIG. 4 shows a simulated band diagram for a similar structure in a GaAs/AlGaAs material system.

The impact of p doping the n side barriers is theoretically calculated for the band-diagram of FIG. 4, where a similar structure in GaAs/AlGaAs material system is simulated. Only the three barriers on the n side are p doped. The left of the figure shows the calculated hole concentration. It can be seen that the doped barriers are fully depleted and result in high hole concentration in the p side of QWs, spatially separated from the dopants.

Figure 5:
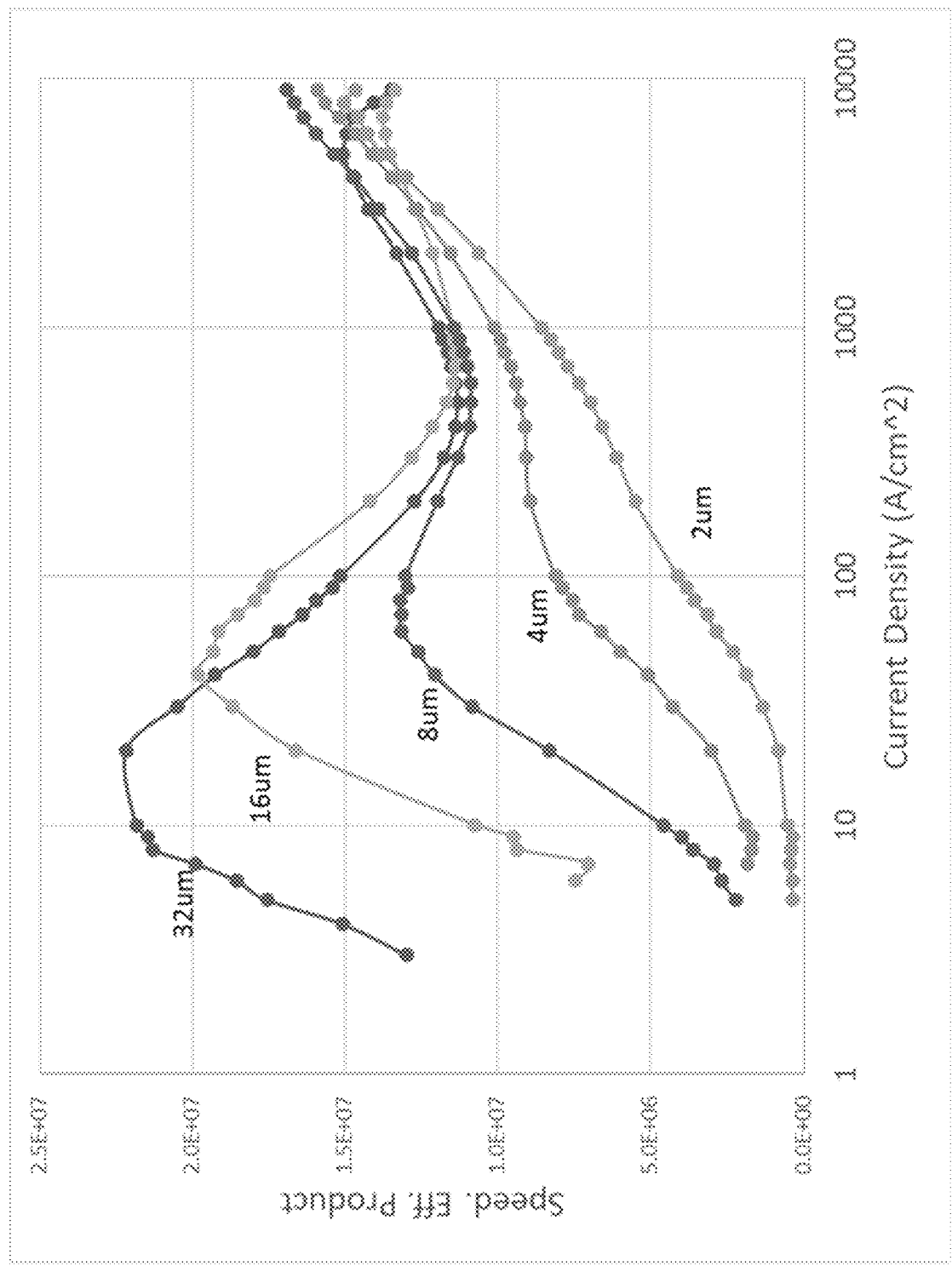

For practical use, preferably the device has high quantum efficiency. FIG. 5 graphs measured speed-efficiency product versus current density for differently sized (e.g., having different widths) LEDs of the structure of FIG. 1a. The larger devices have high peaks at 10 to 50 A/cm$^2$ that are missing for the smaller devices. This may be because surface recombination is much higher in smaller devices, and this surface recombination is dominant at low current densities (e.g., the A term in Eqs. 1-4.)

This low current, high-speed operation of the devices may be significant for practical applications. Reliability, heating, and lifetime are all improved at low current densities. Larger devices typically allow relaxed alignment tolerances in coupling to fiber or other waveguide structures. In some embodiments, the LED diameters or edge widths are in the range of 10 um to 20 um. A practical application might be, for example, use of a 12 um diameter device at 50 A/cm$^2$, operating at 2 Gb/s and 430 nm wavelength. Such a device would use a 50 uA drive current and might generate about 30 uW of output optical power for an assumed 20% external quantum efficiency. If coupled through an optical system with a loss of 10 dB to an efficient photodetector, and an efficient photodetector would generate a signal current of 1 uA, sufficient for a bit error rate (BER) of $10^{-15}$. The transmitter efficiency, running at a modulation swing of 2 V would be about 50 fJ/bit.

In some embodiments a GaN based LED is part of an optical communication or processing system. In some embodiments the optical communication system provides for communication of data between semiconductor chips or portions of semiconductor chips. In some embodiments the optical processing system provides for time of flight information for light generated by the LED. In some embodiments the LED includes a p region, and n region, and an active region between the p region and the n region, the active region including a plurality of quantum well layers separated by barrier layers, some of which are doped and some of which are not doped. In some embodiments the doping for the barrier layers is p doping. In some embodiments the p doping is with Mg. In some embodiments a first two of the barrier layers closest to the p region are not p doped and at least some of others of the barrier layers are p doped. In some embodiments, a majority of the p doped barrier layers are more distal from the p region than a majority of the not p doped barrier layers. In some embodiments the GaN based LED is as discussed elsewhere herein, including as shown or described in the figures, which are expressly made part of this disclosure.

Figure 6:
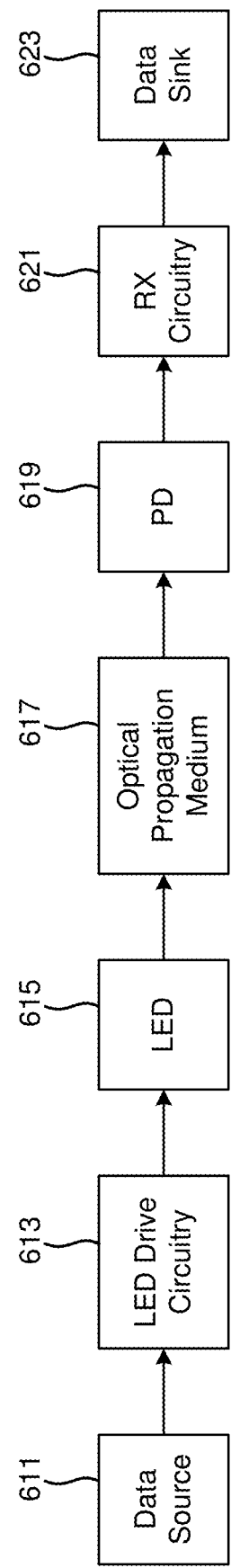
FIG. 6 is a block diagram of an optical communication or processing system making use of a GaN based LED as a light source, in accordance with aspects of the invention.

FIG. 6 is a block diagram of an optical communication or processing system making use of a GaN based LED as a light source, in accordance with aspects of the invention. In some embodiments the LED is as variously discussed herein. In FIG. 6, a data source 611 provides data. The data source may be, for example, a semiconductor chip with logic circuitry. The logic circuitry may perform various operations on or with data, and the logic circuitry may include or comprise a processor. The data source provides the data to LED drive circuitry 613. The LED drive circuitry activates an LED to generate light encoding the data. In some embodiments the LED drive circuitry activates the LED 615 with current expected to drive the LED with a current density of 500 Amps/cm$^2$ or less. In some embodiments the LED drive circuitry activates the LED with current expected to drive the LED with a current density of 100 Amps/cm$^2$ or less. In some embodiments the LED drive circuitry activates the LED with current expected to drive the LED with a current density of 80 Amps/cm$^2$ or less. In some embodiments the LED drive circuitry activates the LED with current expected to drive the LED with a current density of 60 Amps/cm$^2$ or less. In various such of these embodiments the LED drive circuitry activates the LED with current expected to drive the LED with a current density of 10 Amps/cm$^2$ or greater. In various of these embodiments the LED drive circuitry activates the LED at a data rate of 1 Gb/s or greater. In various of these embodiments the LED drive circuitry activates the LED at a data rate of 1.5 Gb/s or greater. In various of these embodiments the LED drive circuitry activates the LED at a data rate of 2.0 Gb/s or greater. In various of these embodiments the LED drive circuitry activates the LED at a data rate of 3.0 Gb/s or greater.

In some embodiments the LED has a 3 dB optical bandwidth for the current and modulation frequency applied by the LED drive circuitry at the modulation frequency. In some embodiments the LED has a cross-sectional maximum width of 50 um, in some embodiments or less. In some embodiments the LED has a cross-sectional maximum width of 32 um, in some embodiments or less. In some embodiments the LED has a cross-sectional maximum width of 16 um, in some embodiments or less. In some embodiments the LED has a cross-sectional maximum width of 8 um, in some embodiments or less. In some embodiments the LED has a cross-sectional maximum width of 4 um, in some embodiments or less.

The light generated by the LED is provided to an optical propagation medium 617. In some embodiments the light is first provided to an optical coupler (not shown in FIG. 6), which passes the light into an optical propagation medium 617. In some embodiments the optical propagation medium is a waveguide. In some embodiments the optical propagation medium is a coherent fiber bundle. In some embodiments the optical propagation medium is free space. The optical propagation medium may be used in transferring the light from one area of a semiconductor chip serving as the data source to another area of the semiconductor in some embodiments. In other embodiments, the optical propagation medium may be used in transferring light from the semiconductor chip to another semiconductor chip, for example another chip including logic circuitry, a memory chip, or other module, for example in a multi-chip module.

The optical propagation medium transfers the light to a detector 619, for example a photodiode, for optical-electrical conversion. In some embodiments the light from the optical propagation medium may first be provided to a further optical coupler, which passes the light to the detector. The detector provides an electrical signal representative of data in the received light to receiver circuitry 621. The receiver circuitry may include, for example, amplification circuitry, for example a transimpedance amplifier, to amplify the signal from the detector and sampling or gating circuitry in providing data of the signal to a data sink 623. In some embodiments the receiver circuitry does not include deserialization circuitry. In some embodiments the data sink may be the same semiconductor chip as providing the data source. In some embodiments the data sink may be a receiver for a time-of-flight device. In some embodiments the data sink may be another chip including logic circuitry, a memory chip, or other module, for example in a multi-chip module.

Although the invention has been discussed with respect to various embodiments, it should be recognized that the invention comprises the novel and non-obvious claims supported by this disclosure.

What is claimed is:

1. A method of operating a GaN based LED, comprising:
applying a current with a data rate of 1 Gb/s or greater to the GaN based LED, the GaN based LED having a cross-sectional width no greater than 100 micrometers, the applied current having a magnitude less than a current that provides a current density of 500 Amperes/centimeter$^2$ to the GaN based LED, the GaN based LED having an optical bandwidth of at least 3 dB for the applied current;
wherein the GaN based LED includes a p type GaN layer and an n type GaN layer, and a plurality of alternating quantum well layers and barrier layers between the p type GaN layer and the n type GaN layer, with a majority of the barrier layers being p doped and some of the barrier layers not being p doped, with the p doped barrier layers positioned more distal from the p type GaN layer than the not p doped barrier layers, with a barrier layer closest to the n type GaN layer being p doped.

2. The method of claim 1, wherein the applied current has a magnitude less than a current that provides a current density of 100 Amperes/centimeter$^2$ to the GaN based LED.

3. The method of claim 2, wherein the data rate is 1.2 Gb/s or greater.

4. The method of claim 1, wherein the applied current has a magnitude less than a current that provides a current density of 80 Amperes/centimeter$^2$ to the GaN based LED.

5. The method of claim 1, wherein the applied current has a magnitude less than a current that provides a current density of 60 Amperes/centimeter$^2$ to the GaN based LED.

6. The method of claim 5, wherein the data rate is 1.5 Gb/s or greater.

7. The method of claim 1, wherein the applied current has a magnitude less than a current that provides a current density of 60 Amperes/centimeter$^2$ to the GaN based LED and a magnitude greater than a current that provides a current density of 10 Amperes/centimeter$^2$.

8. The method of claim 1, wherein the p doped barrier layers are doped with Mg.

9. The method of claim 1, wherein the GaN based LED has 5 quantum well layers and 5 barrier layers, and a first two of the barrier layers closest to the p-type GaN layer are not p doped.

10. The method of claim 1, wherein the GaN based LED has a cross-sectional area between 16 and 400 micrometers$^2$, inclusive.

11. The method of claim 1, wherein the GaN based LED has a cross-sectional area between 64 and 1024 micrometers$^2$, inclusive.

12. A method useful in providing chip-to-chip communications, comprising:
receiving a serial data signal stream;
providing a drive current to a GaN based LED, the drive current based on data of the serial data signal stream to encode data of the serial data signal stream onto light emitted by the GaN based LED at a data rate of 1 Gb/s or greater, the drive current having a maximum magnitude in Amperes of less than 500 times an area of cross-sectional width of the GaN based LED in centimeters;
wherein the GaN based LED includes a p type GaN layer and an n type GaN layer, and a plurality of alternating quantum well layers and barrier layers between the p type GaN layer and the n type GaN layer, with a majority of the barrier layers being p doped and some of the barrier layers being undoped, with the p doped barrier layers positioned more distal from the p type GaN layer than the undoped barrier layers, with a barrier layer closest to the n type GaN layer being p doped.

13. The method of claim 12, wherein the drive current has a maximum magnitude in Amperes of less than 100 times an area of cross-sectional width of the GaN based LED in centimeters.

14. The method of claim 13, wherein the GaN based LED has a cross-sectional width of 32 micrometers or less.

15. The method of claim 12, wherein the drive current has a maximum magnitude in Amperes between 100 times an area of cross-sectional width of the GaN based LED in centimeters and 10 times an area of cross-sectional width of the GaN based LED in centimeters.

16. The method of claim 12, wherein the p doped barrier layers are doped with Mg.

17. The method of claim 12, wherein the GaN based LED has 5 quantum well layers and 5 barrier layers, and a first two of the barrier layers closest to the p type GaN layer are undoped.

18. The method of claim 12, wherein the GaN based LED has a cross-sectional area between 16 and 400 micrometers$^2$, inclusive.

19. The method of claim 12, wherein the GaN based LED has a cross-sectional area between 64 and 1024 micrometers$^2$, inclusive.

20. An LED comprising:
   a p type GaN layer;
   an n type GaN layer; and
   a plurality of alternating quantum well layers and barrier layers between the p type GaN layer and the n type GaN layer, with a majority of the barrier layers being p doped and some of the barrier layers not being p doped, with the p doped barrier layers positioned more distal from the p type GaN layer than the not p doped barrier layers, with a barrier layer closest to the n type GaN layer being p doped.

21. The LED of claim 20, wherein the p doped barrier layers are doped with Mg.

22. The LED of claim 20, wherein the LED has 5 quantum well layers and 5 barrier layers, and a first two of the barrier layers closest to the p type GaN layer are not p doped.

* * * * *